United States Patent [19]

Montgomery

[11] Patent Number: 4,868,569
[45] Date of Patent: Sep. 19, 1989

[54] BIPHASE DIGITAL LOOK-AHEAD DEMODULATING METHOD AND APPARATUS

[75] Inventor: Michael A. Montgomery, Austin, Tex.

[73] Assignee: Schlumberger Well Services, Houston, Tex.

[21] Appl. No.: 244,642

[22] Filed: Sep. 12, 1988

Related U.S. Application Data

[63] Continuation of Ser. No. 133,058, Dec. 15, 1987, abandoned.

[51] Int. Cl.⁴ ............................................. H03K 13/24
[52] U.S. Cl. .......................................... 341/70; 375/87; 341/53
[58] Field of Search ....................... 375/87; 341/50, 70

[56] References Cited

U.S. PATENT DOCUMENTS

| | | | |
|---|---|---|---|
| 2,700,155 | 1/1955 | Clayden | 340/347 DD |
| 3,659,286 | 4/1972 | Perkins | 340/347 DD |
| 3,836,956 | 9/1974 | Cross . | |
| 4,080,572 | 3/1978 | Hastings et al. . | |
| 4,092,491 | 5/1978 | Frazer . | |
| 4,146,743 | 3/1979 | Raynham . | |
| 4,146,841 | 3/1979 | McRae . | |
| 4,167,760 | 9/1979 | Decker . | |
| 4,223,326 | 9/1980 | D'Amato et al. . | |
| 4,242,755 | 12/1980 | Gauzan . | |
| 4,313,206 | 1/1982 | Woodward . | |
| 4,320,525 | 3/1982 | Woodward . | |
| 4,361,895 | 11/1982 | Khoudari . | |
| 4,513,427 | 4/1985 | Borriello et al. . | |
| 4,562,582 | 12/1985 | Tokura et al. . | |
| 4,592,072 | 5/1986 | Stewart . | |
| 4,603,322 | 7/1986 | Blair . | |
| 4,675,884 | 6/1987 | Nakamura | 375/87 |
| 4,745,626 | 5/1988 | Wells | 375/87 |

OTHER PUBLICATIONS

No Author Stated, "IBM Technical Disclosure Bulletin", vol. 29, No. 3, Aug. 1986, ©IBM Corp 1986, pp. 1417-1420.

Primary Examiner—William M. Shoop, Jr.
Assistant Examiner—Helen Kim
Attorney, Agent, or Firm—Cox & Smith Incorporated

[57] ABSTRACT

A method and apparatus for digitally decoding a biphase encoded transmission signal, which combines both clock and data signals with a high degree of noise immunity. The decoding method has a skew tolerance nearly equivalent to using conventional decoding methods with twice the sampling rate. The method utilizes a unique look-ahead feature to resolve otherwise ambiguous signals.

14 Claims, 6 Drawing Sheets

BIPHASE DIGITAL LOOK-AHEAD DEMODULATING METHOD AND APPARATUS

This application is a continuation of my co-pending application Ser. No. 133,058 filed on Dec. 15, 1987, now abandoned.

BACKGROUND OF THE INVENTION

1. Field Of The Invention

The present invention relates to systems and methods for decoding transmitted data, and particularly, although not exclusively, to systems and methods for decoding data transmitted to and from down-hole tools used during logging operations to investigate earth formations traversed by bore-hole.

2. Background

In many applications, it is desirable to reliably transmit digital data encoded in such a manner that the clock signal and data signal are contained within one signal. That permits remote transmission in situations where the receiver is not synchronized to the transmitter, and where transmitting an additional signal containing just the clock signal is not feasible due to skew or channel constraints. There are, of course, several possible encoding schemes for combining the clock and data signal. The two most frequently used baseband methods are biphase encoding and Manchester encoding. Those two encoding schemes and others can be derived from one another, such that most of the encoding and decoding methods that are applicable to any of those baseband schemes may be applied with some small transformation to the other baseband encoding schemes.

These encoding schemes involve frequency modulating a pulse train in accordance with a data signal. The pulse train carrier is generated such that each transition represents the start of a new clock cycle. In biphase encoding, the carrier is, further modulated by adding an extra transition in the middle of the clock cycle if the corresponding data signal is a one. The lack of a mid-cycle or mid-bit transition represents a data signal of zero. In biphase code, the directions of the transitions are ignored in the decoding process.

Circuitry for decoding combined data and clock signals for those schemes have been designed. However, the complexity of the circuits necessary for decoding encoded signals is dependent upon the degree of noise immunity desired. Whenever a signal is transmitted, it is affected by energy present in the environment, referred to as noise, which tends to distort the signal. That distortion typically manifests itself by skewing the edges of the signal. In order to recover the original data that was transmitted, it is necessary to examine the received signal to determine which transmitted value could be distorted with the smallest amount of noise to result in the signal received. That is, a decision must be made as to which transmitted value is most probable. The effectiveness with which that decision is made determines the noise immunity of a particular circuit.

There are two primary methods for accomplishing the decoding: analog and digital. The analog methods use analog circuitry such as a phase locked loop to recover the clock information present in the transmitted signal. That recovered clock information is then used to determine the data values in the signal. The digital methods generally use an external decoder clock operating at a frequency that is approximately equal to a multiple of the transmitted clock frequency. That clock is used to sample the transmitted signal at various points. Those samples are then used to determine the clock value and data value embedded in the combined signal by detecting transitions within the signal. Since the approximate frequency of the transmitted clock signal is known, a transition followed by another transition one transmitted clock period later can be decoded as a zero data signal and one transmitted clock cycle. The second transition is then regarded as the start of another bit cycle. If the next transition occurs at the end of the bit cycle, another zero is decoded. On the other hand, if the next transition occurs in the middle of the bit cycle, a one is decoded with the following transition marking the start of a new bit cycle. Because of both sampling error and skewing of the signal edges, however, transitions may not occur or be detected at precisely the times indicated above. In such cases, the transition is decoded as that transmitted value which is the most probable to have been transmitted. For example, a transition occurring before $\frac{3}{4}$ bit time is read as a one, while a transition occurring after $\frac{3}{4}$ bit time is read as a zero and the start of another bit cycle.

For digital decoding, at least eight equally spaced samples per data bit are generally required for reliable decoding. That requires a decoder clock operating at eight times the transmitted clock frequency. As the number of samples per bit is increased, the amount of data available for making the decoding decision is increased such that it is possible to gain greater noise immunity. The cost for doing so, however, is that a clock operating at a higher frequency must be built, and the decoding circuit must be able to operate at a correspondingly faster speed. Operation at higher speeds typically requires more expensive and carefully designed circuitry. In some cases, commercially available components cannot be found to operate at such speeds.

SUMMARY OF THE PRESENT INVENTION

It is an object of the present invention to provide a system and method for digitally decoding signals containing encoded clock and data signals.

It is a further object of the present invention to provide a method and apparatus for decoding transmitted data which has been distorted by noise, typically by the skewing of the signal edges.

The present invention discloses a method and apparatus for decoding a biphase encoded transmission signal. In order to gain greater noise immunity, the apparatus uses a look-ahead demodulating method for transitions occurring within the sample time containing the $\frac{3}{4}$ bit time. It is ambiguous as to whether that transition represents the end of a zero or the first transition of a one. Without further information, both are equally probable.

According to the biphase digital look-ahead demodulating method, the decoding decision for a current input data transition occurring at $\frac{3}{4}$ bit time is deferred until samples of the next transition have been examined. Those samples of the next data transition provide additional information useful in making a more reliable decoding of the current data transition. The present invention permits a system and method having a noise immunity at the worst case equal to that of a conventional decoding circuit operating at twice the normal speed, and in many cases provides greater noise immunity than conventionally available.

These and other objects, features and advantages of the invention will become evident in light of the following detailed description, viewed in conjunction with the referenced drawings of a preferred biphase digital look-ahead demodulating method and apparatus according to the present invention. The foregoing and following description of the invention is for exemplary purposes only. The true spirit and scope of the invention is set forth in the appended claims.

DETAILED DESCRIPTION OF THE INVENTION

Prior conventional digital decoding schemes attempt to determine that value of the transmitted data bit at time when it is perceived that the last sample associated with that bit has been received or earlier. That is usually done by first determining which samples mark the beginning of a bit edge. At that point, a time is started which times for $\frac{3}{4}$ of a bit. In the case of positive biphase data, if a transition occurs before the $\frac{3}{4}$ bit time, the decoder emits a value of one. Otherwise, the decoder emits a value of zero. The next transition after the $\frac{3}{4}$ bit time is then used to mark the beginning of the next bit and processed is repeated. If a transition occurs within a sampling interval containing the $\frac{3}{4}$ bit time, it is unresolvable as to whether it marks the beginning of a new bit or a late second transition for a value of one. If the sampling frequency is eight times the transmitted clock frequency, the maximum edge skew tolerance is a $\pm 1/16$ of a bit due to the $\frac{1}{8}$ bit maximum sampling error. If the system were to operate at double the speed, the sampling error would be 1/16 bit and the edge skew tolerance would be $\pm 3/32$ of a bit.

Figure 1:
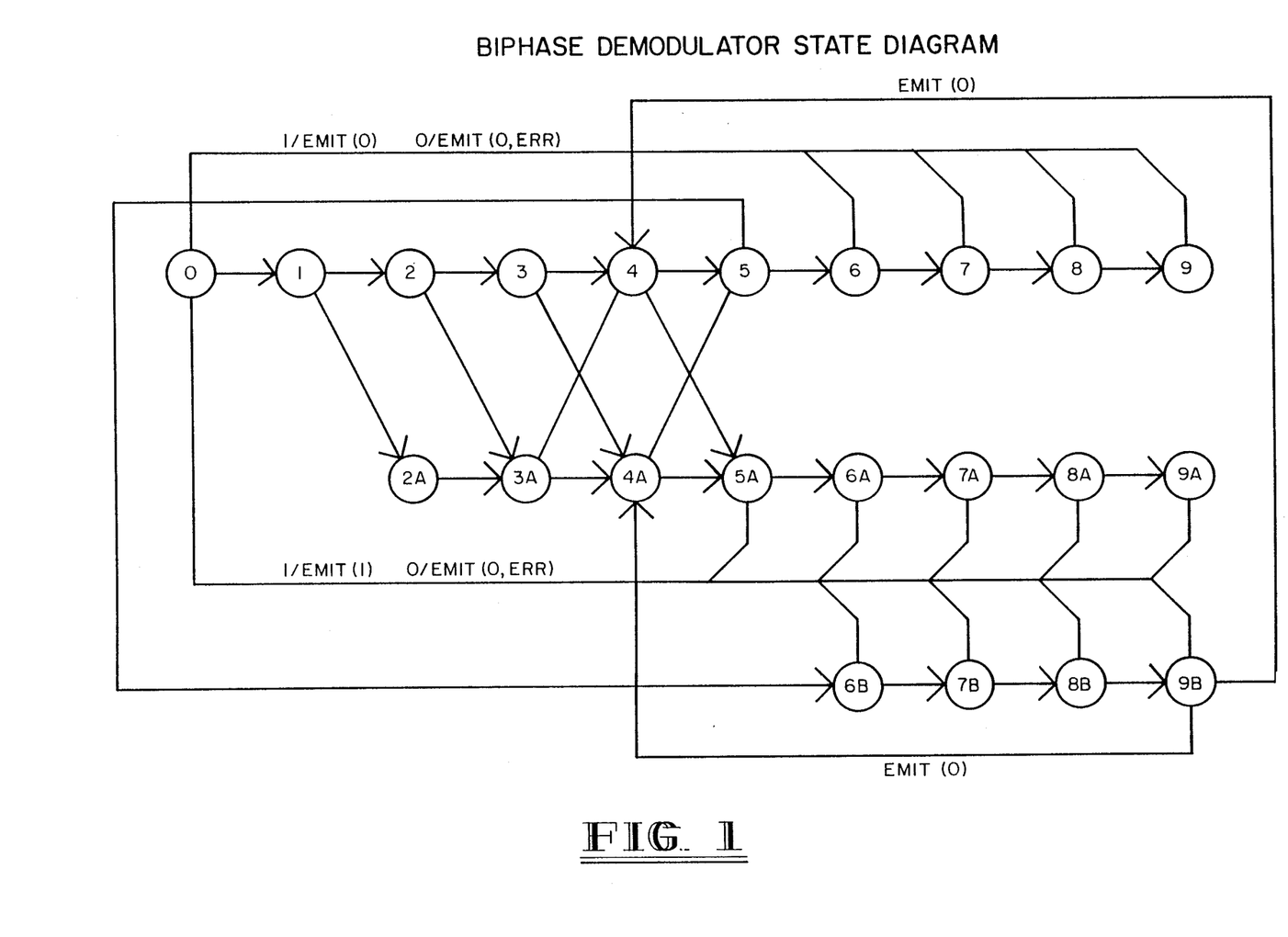
FIG. 1 is a state diagram illustrating the biphase demodulator method.

The method of the present invention, as depicted in FIG. 1, incorporates and improves upon the algorithm described above. Referring to FIG. 1, the improved algorithm is represented by a state machine which changes state each time the biphase input is sampled at a rate eight times the bit or transmitted clock frequency. Each of the circles represents a separate state, and the lines with arrows show the progression of the machine from state whether or not a transition of the biphase input was detected during the sample. The numbers "0" or "1" on each of the lines represent the absence and presence, respectively, of a transition and determine which state the machine will move to next. The lines with EMIT statements represent decoded outputs, either a one or a zero. Which EMIT statement is chosen for outputting depends in some cases on whether there was a transition or not in the previous sample, represented by a preceding "1/" or "0/", respectively. In addition, if a coding error in the input is detected due to, for example, excessive skewing, an error signal, "ERR", is output. The value S11D16 refers to the presence or absence of a transition during an extra sample taken between state 4 and state 5. The purpose of this extra sample will be described below.

State 0 is the normal starting state after reset or after the final edge of any bit is detected. The next state numbers on each of the state circles in FIG. 1 refer to each state the machine sequentially moves to each time the input is sampled. Once the final edge of a bit is detected and the machine is in state zero, it continues progressing directly from left to right waiting for a transition of the biphase input. If that occurs after state 6 is reached, the bit is recognized as a zero value and the machine resets to state zero. If that does not occur after state 9, a zero value is still emitted, the machine resets to state zero, and a biphase error is asserted. Because state 5 is the $\frac{3}{4}$ bit time state, states 6, 7, 8, and 9 mentioned above refer to a bit with a single transition after the $\frac{3}{4}$ bit time and before 5/4 bit time, which is a solid zero value. If the transition does not occur by the 5/4 bit time, that it is an illegal biphase signal which is then flagged as bad.

If a transition occurs before state 5, the $\frac{3}{4}$ bit time, the state machine drops down to the "A" states indicating that the first transition of a one value has been detected. The machine then continues to the right, waiting for the final transition of the one value. If a second transition occurs before state 5A is reached, a biphase error is asserted and the machine goes back to the top path. That may be thought of as considering that the two transitions must have been a noise spike and therefore discarding both. If a transition occurs after state 5A, it is considered the second transition of the one value; therefore, a one value is emitted and the machine resets to state "0". If no transition occurs by state 9, the 5/4 bit time, the signal is flagged as an illegal biphase signal.

If a transition occurs at exactly state 5, the $\frac{3}{4}$ bit time, the machine drops down to the "B" states indicating an uncertainty as to whether that transition was the final transition of a zero value or the first transition of a one value. If a second transition occurs during states 6B, 7B, or 8B, it is considered the final transition of a one value; therefore a one is emitted and the machine resets to state "0". If a second transition does not occur after state 9B, the first transition can definitely be determined to be the final transition of a "0" value, and "0" value is emitted. However, since the transition has actually occurred four states earlier, it is necessary to reset to state 4, indicating that the last four samples must have been part of the following bit.

If a transition occurs at exactly state 9B, the 5/4 bit time, the sampling error still renders it impossible to determine if the two transitions refer to a long one value, or a very short zero value followed by the first transition of a short one value. Correctly resolving that question is necessary in order to guarantee 3/32 bit edge skew tolerance in all cases. That question is resolved by taking a sample of the input using the negative edge of the clock to determine whether the transition at state 5 occurs during the second half of the sample time or during the first half. Since this sample is taken between the sample containing the $\frac{3}{4}$ bit time and the sample containing the $\frac{7}{8}$ bit time, it will be referred to as the 11/16 bit time sample. If the transition occurred within the 11/16 bit time sample, the value is considered a one. Otherwise, the value is considered a zero. If one is determined, the machine resets to state 0 and emits a one value. If a zero is determined, the machine resets to state 4A indicating that the first transition of the next bit has been detected, and a zero value is emitted.

Figure 2:
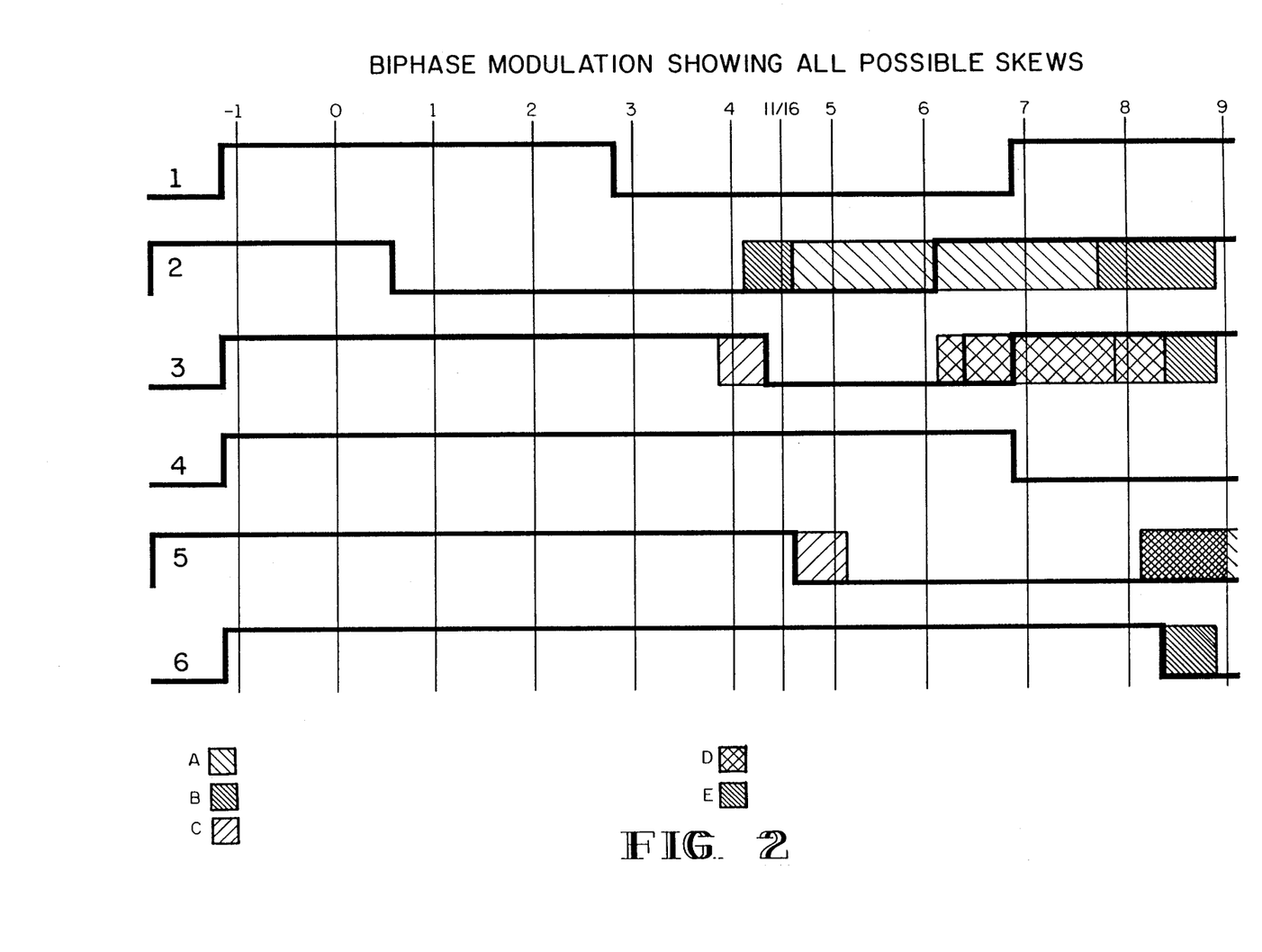
FIG. 2 illustrates the biphase modulation, according to the present invention, showing all possible skews.

The biphase demodulator tolerance to skews on the edges of the biphase input, as pointed out above is illustrated in FIG. 2 by six wave forms. Those wave forms show that the demodulator has worst case edge skew tolerance of $\pm 3/32$ bit. Wave 1 shows a perfect biphase "1". Wave 2 shows a biphase "1" with the maximum possible sampling error and the worst case negative skews on the edges. When compared to wave 1, the first edge of wave 2 starts just under ⅛ of a bit sooner. That represents the maximum sampling since samples are taken at eight times the bit rate. By skewing the first edge 3/32 forward, and the second edge 3/32 backward, one can obtain a positive pulse only two samples wide. The nominal (no skew) position of the third edge is shown in bold line. By skewing the third edge by 3/32, one can make the negative pulse with 4, 5, 6, or 7 samples wide. That is shown by the lightly shaded area A. In each case, the demodulator correctly decodes a value of "1". In fact, the entire area covered by the darkly shaded area B will be decode correctly.

Wave 3 shows a biphase "1" with the maximum possible sampling error and the worst case positive skews on the edges. By skewing the first edge 3/32 back, and the second edge 3/32 forward one can obtain a positive pulse up to 6 samples wide. is less than the shaded amount, the positive pulse could be no more than five samples wide, and the "B" states in the state machine (see FIG. 8) would not be entered. The nominal (no skew) position of the third edge is shown in bold line. By skewing the third edge by 3/32, one can make the negative pulse with 2, 3, or 4 samples wide. If the pulse rises within the cross-hatched area D, the 11/16 sample is not needed since the state machine could not have reached state 9B. Only if the pulse rises within the lightly shaded area A will the 11/16 sample be required. In that case, because the second edge must fall before the 11/16 sample time, by determining that the 11/16 sample and the ¾ (state 5) sample are the same, one can correctly decode the value of "1". The darkly shaded area B following indicates the additional skew that can be tolerated and still decoded correctly.

Wave 4 shows a perfect biphase "0". Wave 5 shows a biphase "0" with the maximum possible sampling error and the worst case negative skews on the edges. When compared to wave 4, the first edge of wave 5 starts just under ⅛ of a bit soon. That represents the maximum sampling error because samples are taken at eight times the bit rate.

By skewing the first edge 3/32 forward, and the second edge 3/32 backward, one can obtain a positive pulse only six samples wide. That cannot be readily distinguished from the beginning of a biphase "one" as illustrated in wave 3. However, because the edge must fall after the 11/16 sample time, by determining that the 11/16 sample and the ¾ (state 5) sample are different, one can correctly decode the value of "0". If the edge falls after the lightly shaded area A the pulse must be seven (7) samples wide and the 11/16 sample is not needed. Also, if the next rising edge occurs after the heavily hatched area E (after state 9B), the 11/16 sample is not needed for correctly decoding the "zero".

Wave 6 shows a biphase "zero" with the maximum possible sampling error and the worst case positive skews on the edges. By skewing the first edge 3/32 backward, and the second edge 3/32 forward, one can obtain a positive pulse up to 10 samples wide. The darkly shaded area B following indicates the additional skew that can be tolerated and still decode the "zero" value correctly.

Figure 3A:
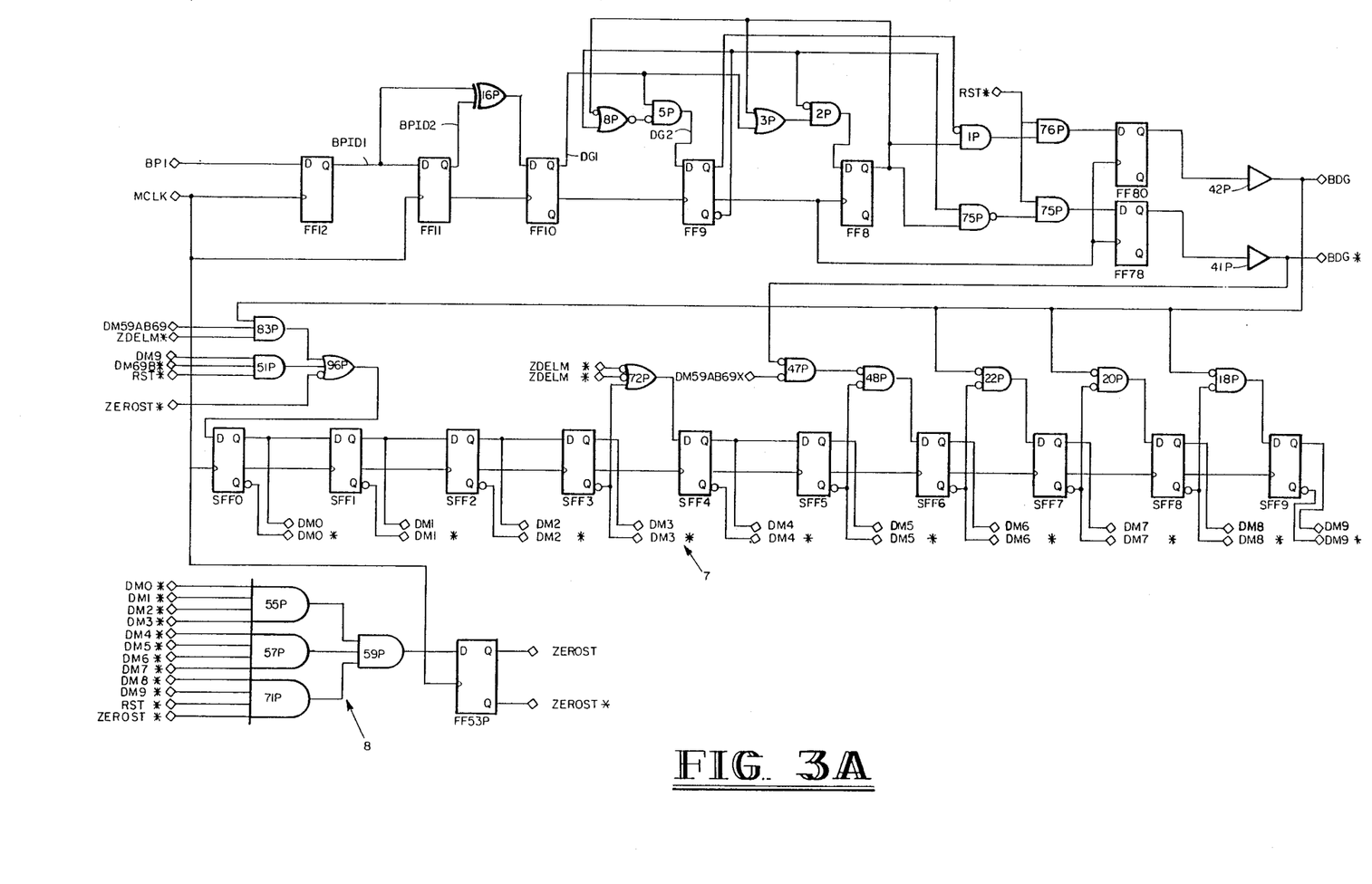
FIGS. 3A, 3B and 3C are schematics illustrating the biphase demodulator circuit of the biphase modem according to the present invention.
Figure 3B:
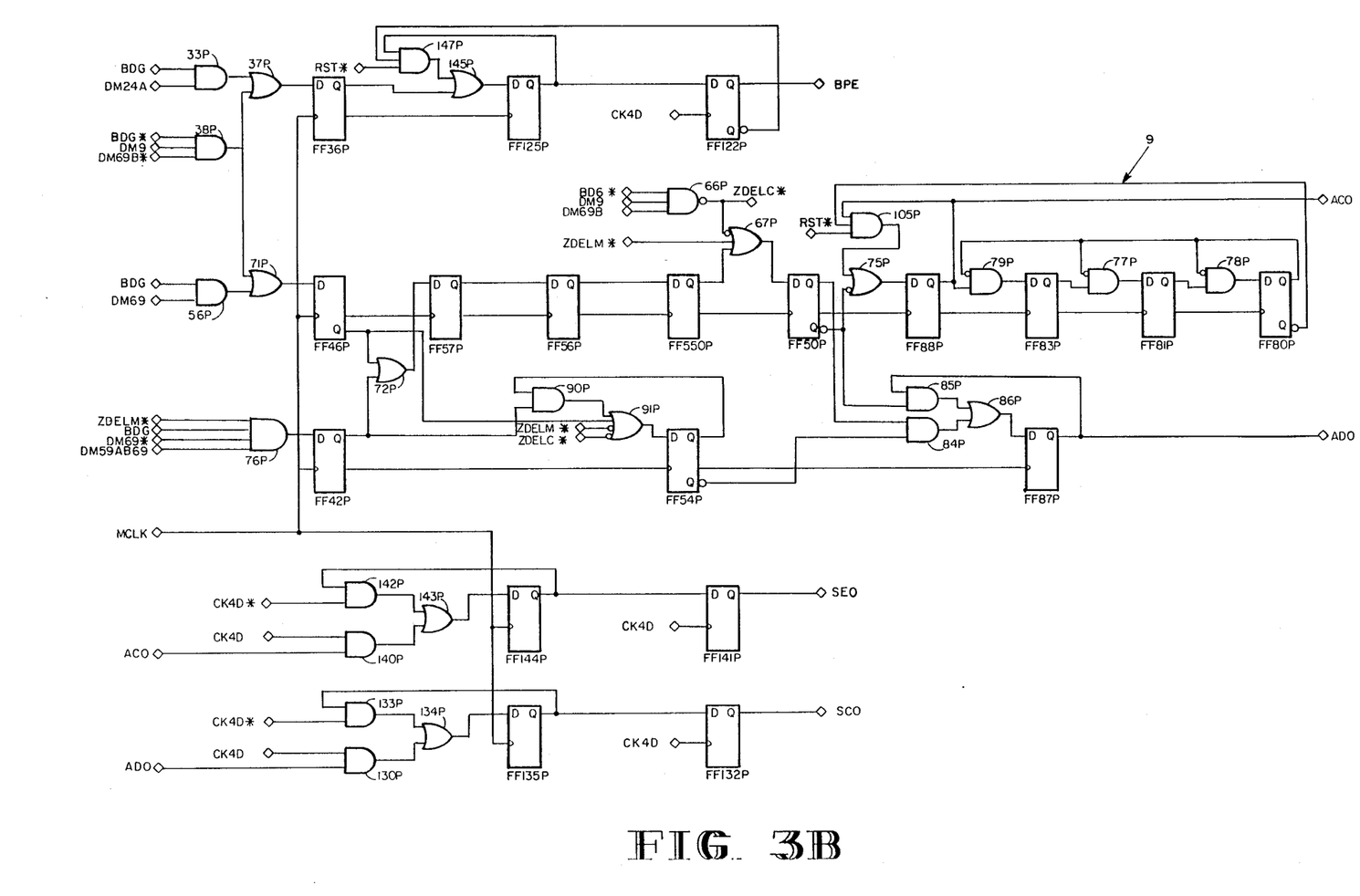
Figure 3C:
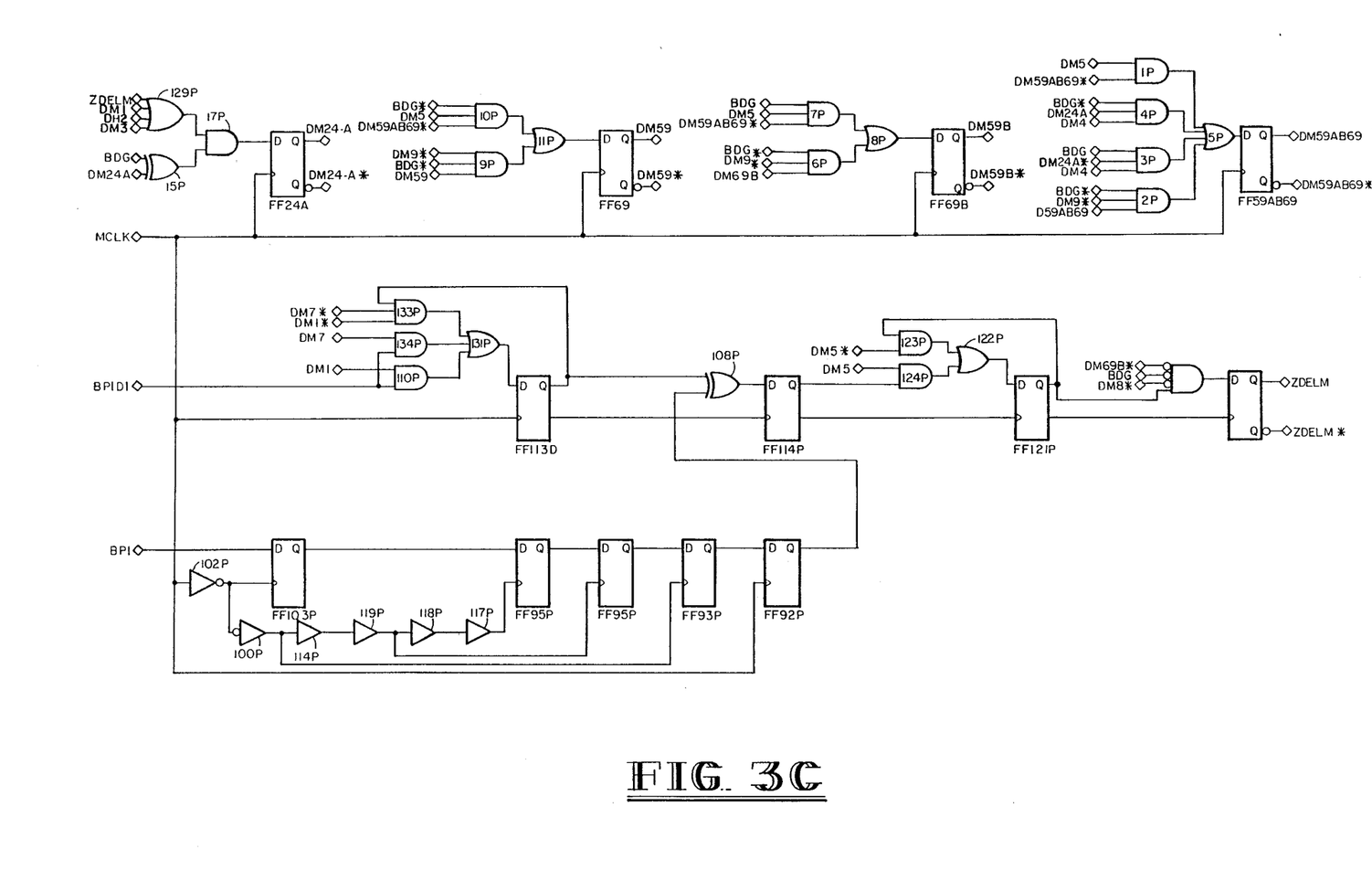

FIGS. 3A, 3B, and 3C are schematics of a particular hardware implementation of the algorithm described above. In the description that follows, an asterisk, "*", appended to any signal represents the inverse of that signal.

Referring first to FIG. 3A, the two primary inputs to the apparatus are MLCK and BPI. MLCK is the master clock signal originating from an oscillator (not shown) and chosen to be a frequency approximately eight times the transmitted clock frequency. Unless otherwise specified, the rising edge of MCLK is used to clock data into all of the D-type flip-flops to be described below. BPI is the biphase input signal which is to be decoded by the apparatus. Samples of BPI are first clocked into flip-flop FF12 on successive rising edges of MCLK. Since MLCK is eight times the transmitted clock frequency, the apparatus takes eight samples of BPI per bit cycle.

Flip-flops FF12 and FF11 and EXCLUSIVE-OR gate 16P make up the edge detector portion of the circuitry. As each sample of BPI is clocked into FF12, the sample taken on the previous clock cycle is shifted into FF11. The output of FF11, BPID1, and the output of FF12, BPID2, are compared by EXCLUSIVE-OR gate 16P. If the two outputs are different, an edge, or transition, is detected and a one is shifted into flip-flop FF10 on the next clock cycle. If no transition is detected, a zero is clocked into FF10.

Flip-flops FF10, FF9, and FF8 make up a digital filter which serves to eliminate transitions occurring on successive clock cycles due to noise. In the description that follows, the outputs of FF10, FF9, and FF8 are referred to as DG1, DG2, and DG3, respectively. The operation of the filter is as follows:

1. If the input DG1 has a 1 value preceded and followed by 0 values, it passes through undisturbed.

2. If the input DG1 has a 0 value, 1 value, 1 value, and finally a 0 value, the 1 values are discarded and the output is all zeros.

3. If the input DG1 has a 0 value, 3 or more subsequent clocks in which the input has a 1 value, and finally a 0 value, these successive 1 values are replaced by a series of 0 values with a 1 value in the center.

Case 2 eliminates transitions due to noise affecting a single sample, and case 3 eliminates spurious transitions due to noise about the 0 crossing of the input signal when it is digitized.

This is implemented using a 3 state filter consisting of flip-flops FF9, FF8, FF80, and FF78. The first state is implemented using an equivalent OR-AND function made up of OR gate 8P and AND gate 5P. The OR function has inputs from DG2 inverted and DG3 inverted to determine if any pulse is already in the 3 stage filter. This goes to the AND function along with the output of DG1 which enables an input pulse to pass to FF9 only if no pulse is in the filter and a new pulse arrives. The second stage is implemented using an equivalent OR-AND function made up of OR gate 3P and AND gate 2P. The inputs to a OR gate 3P is DG1 and DG3 inverted. This is used as an input to the AND function along with DG2 in order to permit a transition at DG2 to pass to the input of FF5 only if either a new transition is occurring at DG1 or if there is no transition at DG3, the first and third stages The final filter stage is broken into two logically identical sections for speed purposes. Any signal being latched by this final stage reflects a transition that has completed all filtering requirements. Thus, this final stage is referred to as the transition latch, and is used to drive the rest of the decoder. The first part of the final stage consists of AND gate 1P and AND gate 76P forming an equivalent three input AND gate with the output point to FF80. The second part consists of AND gate 75P and AND gate 82P functioning as a three input AND gate with the output going to FF78. When the main reset signal RST* going to AND gate 76P and AND gate 82P goes low, both of the outputs BDG and BDG* are forced low. Otherwise, when both of the inputs to AND gate 75P consisting of DG2 inverted and DG3 are high, the output BDG goes high at the next clock transition. Similarly, the inputs to NAND gate 75 are exactly inverted, so BDG* goes to exactly the opposite state as BDG. This allows a transition in the previous stage to pass to this transition latch only if the preceding stage has no transition in progress. Buffers 41P and 42P are used to provide buffering of the outputs to drive the large number of attached devices.

The phase counter 7 is a register of ten flip-flops, the outputs of which represent the states 0 through 9 of the state machine described earlier. Whether the state is an "A" or "B", state is represented by additional signals to be described below. These flip-flops are designated as SFF0 through SFF9; their respective outputs are designated DM0 through DM9, respectively. When the apparatus is in the 0 state, DM0 is high (i.e., a one) and the rest of the phase counter flip-flops contain a zero. As the one contained in SFF0 is clocked sequentially into each succeeding flip-flop of the phase counter register, the state of the apparatus changes accordingly. Since a zero is clocked successively have a high output, representing one of the ten states 0 through 9. When the apparatus returns to the 0 state from any other state, a one is again clocked into SFF0 and the rest of the flip-flops in the phase counter are cleared.

Reset signal RST is normally low, but is asserted high during power up, or any other time reinitialization is required from an external source. In order to fully reset the apparatus, RST should remain asserted for at least ten clock cycles. When RST is high, RST* is low which clears the transition latch as described above, thus setting BDG to zero which keeps the output of AND gate 83P low. The output of AND gate 51P is also kept low since one of its inputs is RST*. The outputs of AND gates 83P and 51P feed into OR gate 96P along with the signal ZEROST. It is the output of OR gate 96P which is clocked into flip-flop SFF0 by MCLCK. Thus, as long as ZEROST is low, MCLCK successively clears SFF0 while RST is asserted. During ten such cycles, all of the flip-flops SFF0 through SFF9 will be cleared.

The signal ZEROST is produced by phase counter starter 8. As shown in FIG. 3A, phase counter starter 8 comprises AND gates 71P, 57P, 55P and 59P which together form an equivalent twelve-input AND gate inputting to which are DM0* through DM9*, RST*, and ZEROST*. The output of the equivalent twelve-input AND gate feeds into the data input of flip-flop FF53. ZEROST* is the output of flip-flop FF53. Thus, only after all the flip-flops of the phase counter 7 are cleared by the assertion of RST can a one be clocked into flip-flop FF53 through the equivalent twelve-input AND gate. After all the phase counter flip-flops are cleared and RST is deasserted, RST* goes high, which causes a one to be clocked into FF53 and drives ZEROST high. Since ZEROST* is then low, the next clock pulse clears FF53 and clocks a one into SFF0 through OR gate 96. At this point, the apparatus is in state 0 of the State Machine Diagram. During succeeding clock cycles, one of DM0 through DM9 will always be high which keeps FF53 cleared and ZEROST low. The apparatus progresses to each higher numbered state of the State Machine Diagram until a condition is reached dictating a return to State 0. When this occurs, a one is clocked into SFF0 through either AND gate 83 or AND gate 51, flip-flops SFF1 through SFF9 are cleared, and the cycle begins again.

Referring now to FIG. 3C, there are shown state latches 24A, 69, 69B and 59AB69 which comprise flip-flops FF24A, FF69, and FF59AB69, respectively, as well as associated data input logic circuitry.

The outputs of the state latches represent the different states of the apparatus as follows:

1. State 24A - States 2A, 3A, or 4A
2. State 69 - States 6, 7, 8, or 9
3. State 69B - States 6B, 7B, 8B, or 9B
4. State 59AB69 - States 5A, 6A, 7A, 8A, 9A, 6B, 7B, 8B, 9B, 6, 7 8 or 9. States 24A, 69, 69B, and 59AB69 are indicated by high states of signals DM24A, DM69, DM69B, and DM59AB69, respectively.

Referring first to state latch 24A, output DM24A is high during States 2A, 3A and 4A and low otherwise. Inputs ZDELM, DM1, DM2, and DM3 are ORed into AND gate P17 by OR gate 129P. ZDELM is a signal produced at State 9B when signals BDG and S11D16 are both high. S11D16 is a signal corresponding to a transition occurring within an extra-sample taken between the samples of State 4 and State 5, and will be described in greater detail below. BDG and DM24A itself are input into EXCLUSIVE-OR gate 15P the output of which also inputs to AND gate 17P. The output of AND gate 17P is the data input of FF24A. The function of EXCLUSIVE-OR gate 15P is used to indicate an exit from State 24A (i.e., states 2A, 3A, or 4A) if a transition occurs during those states, as indicated by a high BDG. If the apparatus is in States 1, 2 or 3 and BDG goes high, however, State 24A is entered. State 24A is also entered from State 9B if both BDG and S11D16 are high, which corresponds to the return to State 4A from State 9B shown in FIG. 1.

The output of state latch 69, DM69, is high during states 6, 7, 8 or 9, and low otherwise. The data input of FF69 consists of the outputs of AND gates 10P and 9P ORed together by OR gate 11P. The inputs to AND gate 10P are BDG*, DM5, and DM59AB69* indicating that the apparatus enters State 69 from State 5 when no transition is detected. Once State 69 is entered, the output of AND gate 10P goes low due to signal DM59AB69* being low. DM69 is kept high by feeding it back through AND gate 9P as long as no transition is detected and State 9 is not reached since the other two inputs to AND gate 9P are DM9* and BDG*.

State latch 69B functions identically to state latch 69 except that State 69B is entered from State 5 when BDG is high rather than low (i.e., when a transition is detected). Accordingly, BDG, DM5, and DM59AB69* are ANDed together by AND gate 7P. BDG*, DM9*, and DM69B are ANDed together by AND gate 6P. The data input of FF69B are the outputs of AND gates 7P and 6P ORed together by OR gate 8P.

State latch 59AB69 comprises AND gates 1P, 4P, 3P, and 2P the outputs of which are ORed together by OR gate 5P which then feeds into the data input of flip-flop FF59AB69. The inputs of AND gate 4P, BDG*, DM24A, and DM4 indicate that State 59AB69 is entered from State 4A only when no transition is detected. The inputs of AND gate 3P, BDG, DM24A*, and DM4 indicate that State 59AB69 is entered from State 4 only when a transition is detected. The inputs to AND gate 1P, DM5 and DM59AB69*, indicate that State 59AB69 is entered from State 5 if the apparatus is not already in State 59AB69. The inpusts to AND gate 2P, BDG*, DM9*, and DM59AB69, indicate that once the apparatus enters State DM59AB69, it remains in that state until State 9, 9A, or 9B is reached or until a transition is detected.

Referring to FIG. 3A, the operation of phase counter 7 will now be described in greater detail. After a one is clocked into SFF0 to indicate State 0, the one is sequentially shifted into flip-flops SFF1 through SFF5 by successive pulses of MCLK to indicate States 1 through 5, respectively. If a transition occurs during States 2 through 4, DM24A is latched high, to indicate the "A" state. If the apparatus is already in an "A" state, DM24A is delatched if a transition occurs. A transition occurring after State 4 latches DM59AB69 high to indicate State 5A. After State 5, the occurrence of a transition, as indicated by a high BDG, drives the apparatus back to State 0 except in the case of State 9B. This logic function is accomplished by AND gates 22P, 20P, and 18P which AND together BDG* and the output of the preceding phase counter flip-flop before inputting to the next flip-flop. If a transition occurs at State 5A, DM59AB69 is latched high which prevents the apparatus from moving to State 6A by means of NAND gate 47P, inputting to which are DM59AB69 and BDG, which then feeds into AND gate 48P along with DM5. A transition occurring at State 5A or any higher numbered state also causes the return to State 0 by means of AND gate 83P, inputting to which are BDG, DM59AB69, and ZDELM*, which allows a one to be clocked into SFF0.

A transition occurring at State 5 moves the apparatus to the "B" states of the State Machine Diagram. This is accomplished by latching DM69B high and the shifting of the one in SFF5 to SFF6 through AND gate 48P.

The operation of phase counter 7 at State 9B will now be described. As shown in FIG. 3B, ZDELC is produced by the ANDing together of BDG*, DM9, and DM69B through AND gate 66P. Thus, a high ZDELC indicates State 9B when no transition is detected. Referring back to FIG. 3A, the output of SFF3, DM3, feeds into OR gate 72P along with ZDELM and ZDELC. If either ZDELM or ZDELC is high, a one is clocked into SFF4 which allows a return to either State 4 or State 4A from State 9B in accordance with the State Machine Diagram of FIG. 1. In these situations, either ZDELM* or BDG will be low which keeps the output of AND gate 83P low and causes a zero to be clocked into SFF0. Otherwise, a one is clocked into SFF0 when the apparatus exits State 9B.

Referring to FIG. 3C, the detection of a transition occurring within an extra sample taken between States 4 and 5 is accomplished by the 11/16 bit transition detector 11. The 11/16 bit sample is obtained with the negative edge of MCLK and clocked into flip-flop FF103P. MCLK is inverted by inverter 102P, thus clocking BPI into FF103P in between the samples of BPI clocked into FF12. The output of FF103P, BPIND1, cannot be clocked immediately into flip-flop FF95P by the rising edge of MCLK since it may not have had time to stabilize. The rising edge of MCLK is, therefore, delayed by inverter 100P and buffers 114P, 119P, 118P and 117P before inputting to flip-flop FF95P. BPIND1 is then successively clocked into flip-flops FF94P, FF93P, and FF92P by the rising edge of MCLK in which the delay time is successively less until FF92P, at which point the clock input is undelayed MCLK. Flip-flops FF103P, FF95P, FF94P, FF93P, and FF92P also delay BPI in phase by five clock cycles.

The value of BPI at State 5 is latched by flip-flop FF113P. AND gates 134P and 110P enable passage of BPID1 during States 7 and 1, respectively, when either DM7 or DM1 is high. BPI is latched at these times in order to correspond to the sample of BPI represented in the transition latch at State 5, which is delayed four clock cycles by FF10P, FF4P, FF8P, and FF80P. The clocked in value is sealed into FF113P by AND gate 133P except during States 1 and 7.

EXCLUSIVE-OR gate 108P determines if BPID5, the output of FF113P, is different from BPIND5. If BPID5 and BPIND5 are different, a one is clocked into flip-flop FF114P; a zero is clocked in otherwise. The output of FF114P, BPITRANS, is clocked into flip-flop 121P during State 5 through AND gate 124P and OR gate 122P. The value is sealed by AND gate 123P except during State 5. The output of FF121P is clocked into flip-flop FF128P through AND gate 130P at State 8B when no transition is detected; FF128P is cleared otherwise. Thus, the output of FF128P, ZDELM, is high during State 9B if a transition occurred within the 11/16 bit sample. This corresponds to the variable S11D16 of the State Machine Diagram equalling one. ZDELM is low otherwise and during all other states.

FIG. 3B shows the output stages of the circuitry. AND gate 33P transmits an error signal through OR gate 37P when a transition occurs during States 2A through 4A. AND gate 38P similarly transmits an error signal when no transition occurs by States 9 or 9A. In both cases, the signal is latched by flip-flop FF36P. The output of FF36P is clocked into FF125P through OR gate 145P. The output of FF125P feeds back to the input through AND gate 147P to maintain the latched value. The error signal is then clocked into FF122P by CK4D, a clock signal equal to MCLK divided by four, in order to synchronize the error signal with CK4D. After one CK4D cycle, FF125P is cleared by the inverted output of FF122P being fed back to AND gate 147P.

When the apparatus decodes a zero, a one is clocked into flip-flop FF46P. When a one is decoded, a one is clocked into FF42P. A one is clocked into FF46P through AND gate 56P and OR gate 71P when a transition occurs during States 6 through 9 and also when no transition occurs by state 9 or 9A which is also an error condition decribed above. A one is clocked into FF42P through AND gate 76P whenever ZDELM is low and a transition occurs during States 5A through 9A or during States 6B through 9B.

Since the decision to emit a one or a zero also implies that the end of a clock cycle has been detected, the outputs of FF46P and FF42P are ORed together by OR gate 72P and clocked into FF57P. The pulse is then clocked sequentially into FF56P and FF55P. The output of FF55P is ORed with the output of AND gate 66P and ZDELM by OR gate 57P and then clocked into flip-flop FF50P which feeds to recovered clock generator 9. The output of AND gate 66P is high when no transition has been detected by STATE 9B. According to the algorithm, this means that both a zero and the end of a transmitted clock cycle should have been emitted four states earlier at State 5B. The output of AND gate 66P ZDELC is four MCLK cycles ahead of the output of OR gate 71P because of flip-flops FF46P, FF57P, FF56P, and FF55P. Similarly, ZDELM also indicates that the state of a clock cycle and a zero should have been emitted four clock cycles earlier.

A one clocked into flip-flop FF50P signifies that the start or end of a transmitted clock cycle has been detected. Recovered clock generator 9 then produces a positive pulse lasting four MCLK cycles to represent the recovered clock signal, referred to as ACO in FIG. 8B. To produce ACO, the output of FF50P is clocked into FF88P through OR gate 75P. The output of FF88P is ACO. Once a one is clocked into FF88P, AND gates 79P, 77P, 78P and 105P and flip-flops FF83P, FF81P, and FF80P continue to clock ones into FF88P for three more MCLK cycles. If by this time FF50P has been cleared, subsequent MCLK cycles will clear FF88P, FF83P, FF81P, and FF80P which enables the output of another four cycle pulse.

AND gate 90P, OR gate 91P, and flip-flop FF54P serve to latch the value corresponding to the decoded data signal latched into either FF46P or FF42P. The output of FF46P, EMIT0, as well as ZDELM and ZDELC are ORed together by OR gate 91P. The inverted output of FF42P, EMIT1*, is NANDed together with the output of FF54P by NAND gate 90P. The output of OR gate 91P is then clocked into FF54P. If EMIT0, ZDELM, or ZDELC are high, a one is clocked into FF54P which indicates a zero data signal is to be emitted. The one in FF54P is maintained by NAND gate 90P as long as EMIT* is high. If EMIT1 goes high, and therefore EMIT1* is low, a zero is clocked into FF54P signifying that a one data signal is to be emitted. FF54P will remain cleared after EMIT1* returns to a high state until either EMIT0, ZDELM, or ZDELC go high.

The inverted output of FF54P is ANDed together with the output DFF50P by AND gate 84P, the output of which is clocked into FF87P through OR gate 86P. Also inputting to OR gate 86P are the output of FF50P and the inverted output of FF87P ANDed together by AND gate 85P. Thus, when the output of FF50P goes high, signifying the start of an emitted clock cycle, the inverted output of FF54P is clocked into FF87P. The output of FF54P is the data signal to be emitted, ADO. After FF50P is cleared, the output of FF87 is maintained on subsequent clock cycles by being fed back to the input through AND gate 85P.

ACO is synchronized with CK4D by AND gates 142P and 140P, OR gate 143P, and flip-flops FF144P and 141P. ACO is clocked into FF 144P by MCLK during the positive phase of CK4D through AND gate 140P. The output of FF144P is reclocked into the input by MCLK during the negative phase of CK4D through AND gate 142P. The output of FF144P is then clocked into FF141P by CK4D to produce SCO, the output of FF141P. SDO, the synchronized data output is similarly produced by AND gates 133P and 130P, OR gate 134P, and flip-flops 135P and 132P. Any phase difference existing between either ACO or ADO and CK4D is thereby removed to produce SCO or SDO, respectively.

The invention described above demodulates biphase code wherein the presence or absence of a mid-bit transition represents either a zero or a one, respectively. In Manchester coding, however, the data and clock signals are encoded such that there is always a mid-bit transition with the direction of the transition signifying either a one or a zero. In other words, in Manchester coding a zero data bit is represented by a zero during the first half of the bit cycle and a one during the second half. Conversely, a one data bit is represented by a one during the first half of the bit cycle and a zero during the second half. Thus, a Manchester encoded signal presents a transition every half-bit cycle except when the data changes from a one to a zero or vice-versa, in which case the next transition does not occur until or after a full bit cycle. The same problem of resolving a transition occurring at ¾ bit time that occurs with biphase coding also occurs with Manchester coding. With such modifications as would be obvious to anyone skilled in the art, the method and apparatus that is the present invention may be adapted to demodulate Manchester encoded signals.

Figure 4:
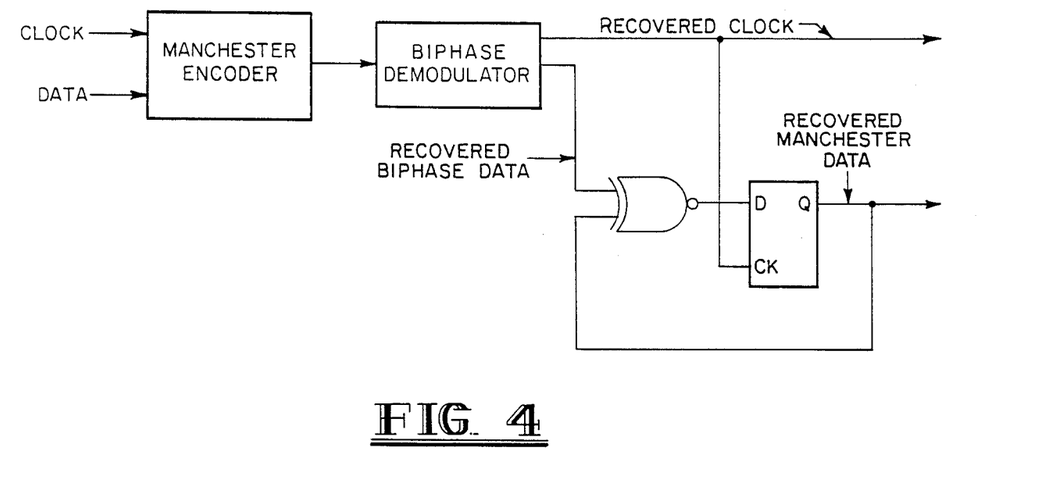
FIG. 4 depicts a filter which enables demodulating of a Manchester encoded signal.

Alternatively, a filter may be added to the apparatus as shown in FIG. 4. The filter comprises an exclusive-NOR gate and a D-type flip-flop. A Manchester encoded signal is input to the biphase demodulator as shown in FIG. 4. Since the input is not biphase code, the biphase demodulator does not extract the clock and data signals directly but produces an output signal still containing that information. The output is then fed to one of the inputs of exclusive-NOR gate 190P, the other input being the output of flip-flop FF190P. The resultant output of the filter corresponds to the decoded clock and data signals.

Although the invention has been described in conjunction with the foregoing specific embodiment, many alternatives, variations and modifications will be apparent to those of ordinary skill in the art. Those alternatives, variations and modifications are intended to fall within the spirit and scope of the appended claims.

I claim:

1. A method for decoding digitally encoded transmission signals where transitions within the transmission signal represent a combination of transmitted clock and data signals, the frequency of the transmitted clock signal is known, successive transitions over a period of time equal to one transmitted clock or bit cycle represent one transmitted clock cycle and a transmitted data signal of one polarity, and successive transitions over one bit cycle with an additional transition occurring mid-way through the bit cycle represent a transmitted clock cycle and a transmitted data signal of the opposite polarity, comprising the steps of:

sampling the transmission signal at a rate equal to some multiple of the transmitted clock frequency;

detecting whether or not a transition of the transmission signal occurred within said sample;

timing the difference between successive transitions;

decoding each transition as the most probable of either the start of a new bit cycle or a mid-bit transition according to the known length of a bit cycle wherein a transition occurring before a ¾ bit time interval after the start of a new bit cycle is decoded as a mid-bit transition while a transition occurring after the ¾ bit time interval is decoded as the start of a new bit cycle; and deferring the decoding decision for a first transition which occurs within a sample time containing the ¾ bit time interval after the start of a new bit cycle until a second transition occurs, at which time the first transition is decoded as a mid-bit transition if the second transition occurs before a specified time interval after the first transition and decoded as the start of a new bit cycle otherwise.

2. The method of claim 1 wherein an error condition is detected if a next transition does not occur by a 5/4 bit time interval after a previous transition.

3. The method of claim 1 further comprising the steps of:
    taking an extra sample of the transmission signal within the sample time containing the ¾ bit time;
    using the presence or absence of a transition in the extra sample to interpret successive transitions occurring within sample times containing the ¾ bit time and 5/4 bit time, respectively, according to the most probable significances of the successive transitions.

4. The method as set forth in claim 1 wherein the specified time interval is equal to one-half of a bit cycle.

5. An apparatus for decoding digitally encoded transmission signals where transitions within the transmission signal represent a combination of transmitted clock and data signals, the frequency of the transmitted clock signal is known, successive transitions over a period of time equal to one transmitted clock or bit cycle represent one transmitted clock cycle and a transmitted data signal of one polarity, and successive transitions over one bit cycle with an additional transition occurring mid-way through the bit cycle represent a transmitted clock cycle and a transmitted data signal of the opposite polarity, comprising:
    means for sampling the transmission signal at a rate equal to some multiple of the transmitted clock frequency;
    means for detecting whether or not a transition of the transmission signal occurred within said sample;
    means for timing the difference between successive transitions;
    means for decoding each transition as the most probable of either the start of a new bit cycle or a mid-bit transition according to the known length of a bit cycle wherein a transition occurring before a ¾ bit time interval after the start of a new bit cycle is decoded as a mid-bit transition, while a transition occurring after the ¾ bit time interval is decoded as the start of a new bit cycle; and
    means for deferring the decoding decision for a first transition which occurs within a sample time containing the ¾ bit time interval after the start of a new bit cycle until a second transition occurs, at which time the first transition is decoded as a mid-bit transition if the second transition occurs before a specified time interval after the first transition and decoded as the start of a new bit cycle otherwise.

6. The apparatus of claim 5 further comprising means for detecting an error condition if a next transition does not occur by a 5/4 bit time interval after a previous transition.

7. The apparatus of claim 6 further comprising:
    means for taking an extra sample of the transmission signal within the sample time containing the ¾ bit time;
    means for using the presence or absence of a transition in the extra sample to interpret successive transitions occurring within sample times containing the ¾ bit time and 5/4 bit time, respectively, according to the most probable significances of the successive transitions.

8. A method for decoding digitally encoded transmission signals where transitions within the transmission signal represent a combination of transmitted clock and data signals, the frequency of the transmitted clock signal is known, a zero during the first half of the bit cycle and a one during the second half of the bit cycle represents a data signal of one polarity, and a one during the first half of the bit cycle with a zero during the second half represents a data signal of the opposite polarity, comprising the steps of:
    sampling the transmission signal at a rate equal to some multiple of the transmitted clock frequency;
    detecting whether or not a transition of the transmission signal occurred within said sample;
    timing the difference between successive transitions;
    decoding each transition as the most probable of either the start of a new bit cycle or a mid-bit transition according to the known length of a bit cycle wherein a transition occurring before a ¾ bit time interval after a mid-bit transition is detected is decoded as the start of a new bit cycle, while a transition occurring after the ¾ bit time interval is decoded as a mid-bit transition; and
    deferring the decoding decision for a first transition occurring after a mid-bit transition which occurs within a sample time containing the ¾ bit time interval after a mid-bit transition is detected until a second transition occurs, at which time the first transition is decoded as the start of a new bit cycle if the second transition occurs before a specified time interval after the first transition and decoded as a mid-bit transition otherwise.

9. The method of claim 8 wherein an error condition is detected if a next transition does not occur by a 5/4 bit time interval after a previous transition.

10. The method of claim 8 further comprising the steps of:
    taking an extra sample of the transmission signal within the sample time containing the ¾ bit time;
    using the presence or absences of a transition in the extra sample to interpret successive transitions occurring within sample times containing the ¾ bit time and 5/4 bit time, respectively, according to the most probable significances of the successive transitions.

11. The method as set forth in claim 8 wherein the specified time interval is equal to one-half of a bit cycle.

12. An apparatus for decoding digitally encoded transmission signals where transitions within the transmission signal represent a combination of transmitted clock and data signals, the frequency of the transmitted clock signal is known, a zero during the first half of the bit cycle and a one during the second half represents a data signal of the opposite polarity, comprising:
    means for sampling the transmission signal at a rate equal to some multiple of the transmitted clock frequency;
    means for detecting whether or not a transition of the transmission signal occurred within said sample;
    means for timing the difference between successive transitions;
    means for decoding each transition as the most probable of either the start of a new bit cycle or a mid-bit transition according to the known length of a bit cycle wherein a transition occurring before a ¾ bit time interval after a mid-bit transition is detected is decoded as the start of a new bit cycle, while a transition occurring after the ¾ bit time interval is decoded as a mid-bit transition; and
    means for deferring the decoding decision for a first transition occurring after a mid-bit transition which first transition is detected within a sample time containing the ¾ bit time interval after the mid-bit transition until a second transition occurs, at which time the first transition is decoded as the start of a new bit cycle if the second transition occurs before a specified time interval after the first transition and decoded as a mid-bit transition otherwise.

13. The apparatus of claim 12 further comprising means for detecting an error condition if a next transition does not occur by a 5/4 bit time interval after the previous transition.

14. The apparatus of claim 13 further comprising:

means for taking the extra sample of the transmission signal within the sample time containing the ¾ bit time;

means for using the presence or absence of a transition in the extra sample to interpret successive transitions occurring within sample times containing the ¾ bit time and 5/4 bit time, respectively, according to the most probable significance of the successive transitions.

* * * * *